United States Patent
Zhang et al.

(10) Patent No.: US 11,430,920 B2
(45) Date of Patent: Aug. 30, 2022

(54) DISPLAY PANEL AND MANUFACTURING METHOD THEREOF

(71) Applicant: TCL CHINA STAR OPTOELECTRONICS TECHNOLOGY CO., LTD., Shenzhen (CN)

(72) Inventors: Xin Zhang, Shenzhen (CN); Zhike Xian, Shenzhen (CN); Ji Li, Shenzhen (CN)

(*) Notice: Subject to any disclaimer, the term of this patent is extended or adjusted under 35 U.S.C. 154(b) by 189 days.

(21) Appl. No.: 17/045,495

(22) PCT Filed: Jul. 14, 2020

(86) PCT No.: PCT/CN2020/101815
§ 371 (c)(1),
(2) Date: Oct. 6, 2020

(87) PCT Pub. No.: WO2021/248617
PCT Pub. Date: Dec. 16, 2021

(65) Prior Publication Data
US 2021/0384381 A1    Dec. 9, 2021

(30) Foreign Application Priority Data

Jun. 8, 2020   (CN) .......................... 202010511266.8

(51) Int. Cl.
| | | |
|---|---|---|
| *H01L 33/46* | (2010.01) | |
| *H01L 27/15* | (2006.01) | |
| *H01L 33/62* | (2010.01) | |
| *H01L 33/00* | (2010.01) | |

(52) U.S. Cl.
CPC ............ *H01L 33/46* (2013.01); *H01L 27/156* (2013.01); *H01L 33/005* (2013.01); *H01L 33/62* (2013.01); *H01L 2933/0066* (2013.01)

(58) Field of Classification Search
None
See application file for complete search history.

(56) References Cited

U.S. PATENT DOCUMENTS

2019/0198733 A1* 6/2019 Yamashita .......... H01L 33/0025

FOREIGN PATENT DOCUMENTS

| CN | 101764146 A | 6/2010 |
|---|---|---|
| CN | 101807656 A | 8/2010 |
| CN | 104733501 A | 6/2015 |
| CN | 109360493 A | 2/2019 |
| CN | 110875438 A | 3/2020 |
| KR | 20200026666 A | 3/2020 |

* cited by examiner

*Primary Examiner* — Robert K Carpenter

(57) ABSTRACT

The present disclosure provides a display panel and a manufacturing method of the display panel. The display panel includes a substrate, a thin film transistor layer, a reflecting layer, an additional layer, and a mini-LED. The thin film transistor layer is disposed on the substrate. The reflecting layer is disposed on the thin film transistor layer. The reflecting layer includes a first through hole. The additional layer is disposed on the reflecting layer. The additional layer includes a second through hole. The additional layer includes particulates. The mini-LED is disposed in the first through hole and the second through hole.

16 Claims, 4 Drawing Sheets

DISPLAY PANEL AND MANUFACTURING METHOD THEREOF

FIELD OF INVENTION

The present disclosure relates to the field of display technologies, and particularly relates to a display panel and a manufacturing method of the display panel.

BACKGROUND OF INVENTION

In prior art, in order to improve a light utilization rate of a light-emitting diode (LED), a reflecting film is generally pasted on an LED substrate, so that light emitted from the LED and light reflected back from a diffusion film above the LED are re-reflected by the reflecting film into a liquid crystal display. However, a thickness of the attached reflecting film is relatively thick, which affects performance of the display panel, and cost is high, which is not conducive to reducing product cycle; furthermore, a manufacturing process of the reflecting film is not compatible with a conventional manufacturing process of a thin film transistor, thereby leading to increased costs.

Technical Problems

The present disclosure provides a display panel and a manufacturing method of the display panel, which can improve performance of the display panel.

Technical Solutions

The present disclosure provides a display panel, comprising:
a substrate;
a thin film transistor layer disposed on the substrate;
a reflecting layer disposed on the thin film transistor layer, wherein the reflecting layer comprises a plurality of first layers and a plurality of second layers, the plurality of first layers and the plurality of second layers are alternately stacked, the plurality of first layers are made of a first refractive index material, the plurality of second layers are made of a second refractive index material, the reflecting layer comprises a first through hole, and the thin film transistor layer is exposed through the first through hole;
an additional layer disposed on the reflecting layer, wherein the additional layer comprises a second through hole, the first through hole and the second through hole penetrate to expose the thin film transistor layer, and the additional layer comprises particulates;
a metal paste layer disposed in the first through hole and the second through hole, wherein the metal paste layer comprises a third through hole, and the third through hole and the second through hole penetrate through the third through hole; and
a mini light emitting diode (mini-LED) disposed in the third through hole to electrically connect the thin film transistor layer.

In the display panel provided by the present disclosure, the particulates comprise one or a combination of two or more materials selected from methyl methacrylate, polystyrene, silicon dioxide, and titanium dioxide.

In the display panel provided by the present disclosure, a diameter of each of the particulates ranges from 5 μm to 30 μm.

In the display panel provided by the present disclosure, a thickness of each of the first layers ranges from 55 nm to 65 nm, and a thickness of each of the second layers ranges from 65 nm to 85 nm.

In the display panel provided by the present disclosure, a refractive index of the first refractive index material is greater than a refractive index of the second refractive index material, the refractive index of the first refractive index material ranges from 1.7 to 2.2, and the refractive index of the second refractive index material ranges from 1.35 to 1.55.

In the display panel provided by the present disclosure, a material of the metal paste layer comprises one or a combination of two or more materials selected from Sn, In, Bi, Cu, Al, and Mo.

The present disclosure also provides a display panel, comprising:
a substrate;
a thin film transistor layer disposed on the substrate;
a reflecting layer disposed on the thin film transistor layer, wherein the reflecting layer comprises a plurality of first layers and a plurality of second layers, the plurality of first layers and the plurality of second layers are alternately stacked, the plurality of first layers are made by a first refractive index material, the plurality of second layers are made by a second refractive index material, the reflecting layer comprises a first through hole, the thin film transistor layer is exposed through the first through hole;
an additional layer disposed on the reflecting layer, wherein the additional layer comprises a second through hole, the first through hole and the second through hole penetrate to expose the thin film transistor layer, and the additional layer comprises particulates; and
a mini-LED disposed in the first through hole and the second through hole to electrically connect the thin film transistor layer.

In the display panel provided by the present disclosure, the particulates comprise one or a combination of two or more materials selected from methyl methacrylate, polystyrene, silicon dioxide, and titanium dioxide.

In the display panel provided by the present disclosure, the diameter of each of the particulates ranges from 5 μm to 30 μm.

In the display panel provided by the present disclosure, a thickness of each of the first layers ranges from 55 nm to 65 nm, and a thickness of each of the second layers ranges from 65 nm to 85 nm.

In the display panel provided by the present disclosure, a refractive index of the first refractive index material is greater than a refractive index of the second refractive index material, the refractive index of the first refractive index material ranges from 1.7 to 2.2, and the refractive index of the second refractive index material ranges from 1.35 to 1.55.

The present disclosure also provides a manufacturing method of a display panel, comprising:
providing a substrate;
forming a thin film transistor layer on the substrate;
alternately stacking a plurality of first layers and a plurality of second layers on the thin film transistor layer to form a reflecting layer, wherein the plurality of first layers are made of a first refractive index material, the plurality of second layers are made of a second refractive index material;
forming an additional layer on the reflecting layer, wherein the additional layer comprises particulates;

etching the reflecting layer and the additional layer to form a first through hole and a second through hole, wherein the first through hole and the second through hole penetrate to expose the thin film transistor layer; and disposing a mini-LED in the first through hole and the second through hole to electrically connect the thin film transistor layer.

In the manufacturing method of the display panel provided by the present disclosure, the particulates comprise one or a combination of two or more materials selected from methyl methacrylate, polystyrene, silicon dioxide, and titanium dioxide.

In the manufacturing method of the display panel provided by the present disclosure, the diameter of each of the particulates ranges from 5 μm to 30 μm.

In the manufacturing method of the display panel provided by the present disclosure, a thickness of each of the first layers ranges from 55 nm to 65 nm, and a thickness of each of the second layers ranges from 65 nm to 85 nm.

In the manufacturing method of the display panel provided by the present disclosure, a refractive index of the first refractive index material is greater than a refractive index of the second refractive index material, the refractive index of the first refractive index material ranges from 1.7 to 2.2, and the refractive index of the second refractive index material ranges from 1.35 to 1.55.

Beneficial Effects

The present disclosure provides a display panel and a manufacturing method of the display panel. The display panel includes a substrate, a thin film transistor layer, a reflecting layer, an additional layer, and a mini-LED. The thin film transistor layer is disposed on the substrate. The reflecting layer is disposed on the thin film transistor layer, and the reflecting layer is made of two materials with different refractive indexes which are alternately stacked. The reflecting layer includes a first through hole, and the thin film transistor layer is exposed through the first through hole. The additional layer is disposed on the reflecting layer, the additional layer includes a second through hole, and the first through hole and the second through hole penetrate to expose the thin film transistor layer. The additional layer includes particulates, and the mini-LED is disposed in the first through hole and the second through hole to electrically connect the thin film transistor layer. In the present disclosure, the reflecting layer is made of two materials with different refractive indexes which are alternately stacked, and the additional layer is disposed on the reflecting layer, which improves utilization ratio and uniformity of light, furthermore improves performance of the display panel.

DESCRIPTION OF DRAWINGS

In order to more clearly explain the technical solution in the present disclosure, the drawings needed in the description of the embodiment will be briefly introduced below. Obviously, the accompanying figures described below are only part of the embodiments of the present disclosure. For those skilled in the art, other drawings can be obtained based on these drawings any creative work.

DETAILED DESCRIPTION OF EMBODIMENTS

The technical solutions in the embodiments of the present disclosure will be described clearly and completely with reference to the drawings in the present disclosure. Obviously, the described embodiments are only a part of the embodiments of the present disclosure, but not all the embodiments. Based on the embodiments in the present disclosure, all other embodiments obtained by those skilled in the art without creative work fall into protection scope of the present disclosure.

Figure 1:
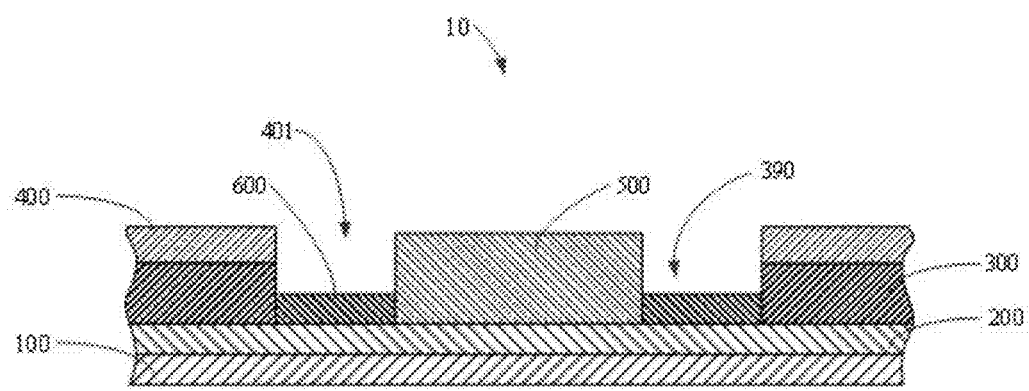
FIG. 1 is a structural sectional diagram of a display panel provided in the present disclosure.

The present disclosure provides a display panel. Referring to FIG. 1, it is a structural sectional diagram of a display panel provided in the present disclosure. The display panel 10 includes a substrate 100, a thin film transistor layer 200, a reflecting layer 300, an additional layer 400, and a mini-LED 500.

The substrate 100 may be a glass substrate.

Figure 2:
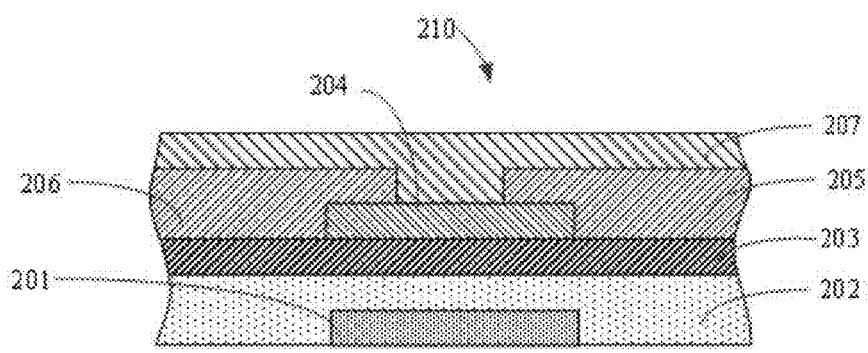
FIG. 2 is a structural sectional diagram of a thin film transistor provided in the present disclosure.

Referring to FIG. 2, it is a structural sectional diagram of a thin film transistor provided in the present disclosure. The thin film transistor layer 200 is disposed on the substrate 100. The thin film transistor layer 200 covers the substrate 100. The thin film transistor layer 200 includes thin film transistors 210. The thin film transistor 210 includes a gate electrode 201, a first protective layer 202, a gate insulating layer 203, an active layer 204, a source electrode 205, a drain electrode 206, and a second protective layer 207. The gate electrode 201 is covered by the first protective layer 202. A material of the gate electrode 201 includes one or a combination of two or more materials selected from Mo, Al, Ti, In, and Ga. The gate insulating layer 203 is disposed on the first protective layer 202. A material of the gate insulating layer 203 includes one or a combination of two or more materials selected from $Al_2O_3$, $SiO_x$, and $SiN_x$. The active layer 204 is disposed on the gate insulating layer 203. A material of the active layer 204 includes amorphous silicon. The source electrode 205 is disposed on one end of the gate insulating layer 203 and one end of the active layer 204. The drain electrode 206 is disposed on the other end of the gate insulating layer 203 and the other end of the active layer 204. The source electrode 205 and the drain electrode 206 are mutually insulated. The source electrode 205, the drain electrode 206 and the gate insulating layer 203 are covered by the second protective layer 207. The second protective layer 207 is configured to protect a structure in the thin film transistor 210, thereby protecting the thin film transistor 210 from being affected by other structures and water oxygen. Besides structures shown in FIG. 2, the thin film transistor 210 also includes other structures, which are not listed herein.

Figure 3:
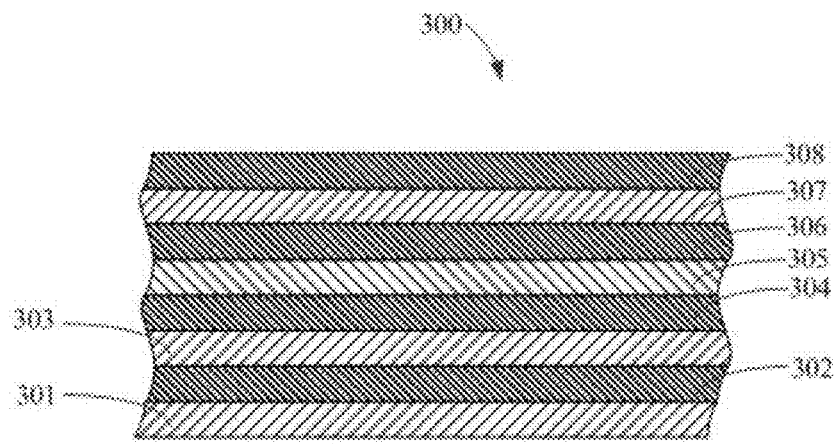
FIG. 3 is a structural sectional diagram of a reflecting layer provided in the present disclosure.

Referring to FIG. 3, it is a structural sectional diagram of a reflecting layer provided in the present disclosure. The reflecting layer 300 is disposed on the thin film transistor layer 200. The reflecting layer 300 is a distributed Bragg reflecting layer. The distributed Bragg reflecting layer is a structure in which light will reflect at the interface when it passes through different media. The reflecting layer 300 includes a plurality of first layers 301 and a plurality of second layers 302. The plurality of first layers 301 and the plurality of second layers 302 are alternately stacked. The first layers 301 are made of a first refractive index material. The second layers 302 are made of a second refractive index material. Wherein a refractive index of the first refractive index material is greater than a refractive index of the second refractive index material. The reflecting layer 300 includes a first through hole 390, and the thin film transistor layer 200 is exposed through the first through hole 390.

In another embodiment, the refractive index of the first refractive index material ranges from 1.7 to 2.2, and the refractive index of the second refractive index material ranges from 1.35 to 1.55.

In another embodiment, the first refractive index material includes one or a combination of two or more materials selected from $SiN_x$, $TiO_2$, ZnS, and $Al_2O_3$. The second refractive index material includes one or a combination of two materials selected from $SiO_2$ and $MgF_2$.

In another embodiment, a thickness of each of the first layers ranges from 55 nm to 65 nm, and a thickness of each of the second layers ranges from 65 nm to 85 nm.

Figure 4:
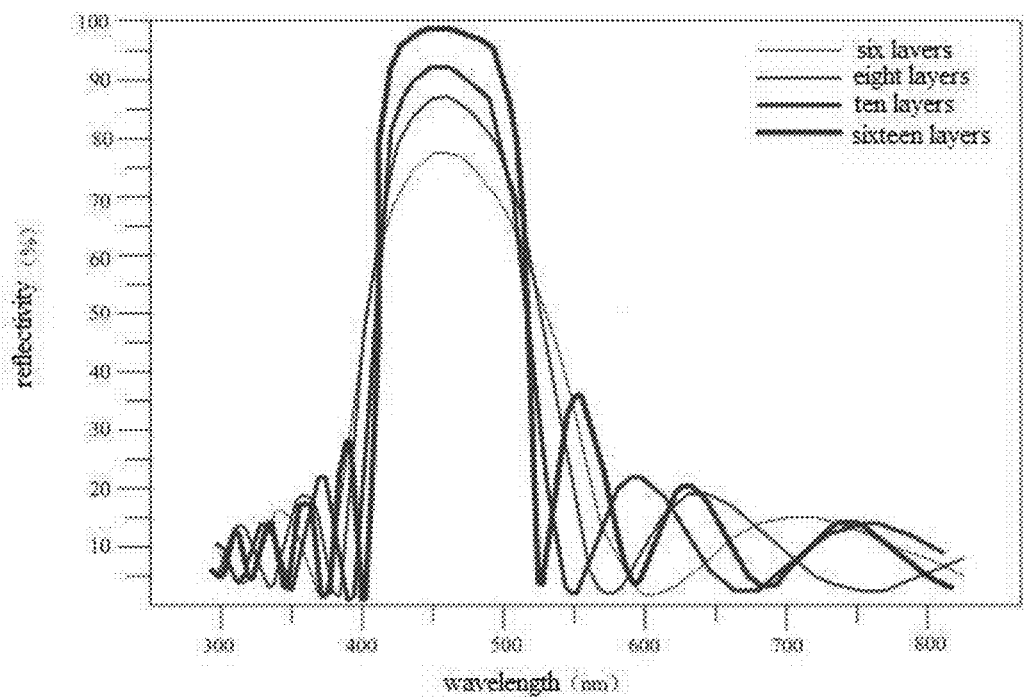
FIG. 4 is a schematic diagram showing a reflectance curve of the reflecting layer provided in the present disclosure.

Referring to FIG. 4, it is a schematic diagram showing a reflectance curve of the reflecting layer provided in the present disclosure. Because the reflecting layer is made of two materials with different refractive indexes which are alternately stacked, light will reflect when it passes through the reflecting layer 300. Because a thickness of every layer is accord with a quarter wavelength, interference between reflected light of each interface is enhanced, thereby improving reflectivity and light utilization of the mini-LED, reducing power consumption, and furthermore improving performance of the display panel. When a number of layers of the reflecting layer 300 varies, a light reflectivity of the reflecting layer 300 is different. A 6-layered reflecting layer structure, that is, two materials with different refractive indexes are alternately laminated to form a total of 6-layered layers, and following 8-layered layers, 10-layered layers, and 16-layered layers are same. Wherein a reflectivity of the 6-layered reflecting layer structure is 75% or more than 75% at the wavelength ranging from 440 nm to 490 nm; a reflectivity of the 8-layered reflecting layer structure is 85% or more than 85% at the wavelength ranging from 440 nm to 490 nm; a reflectivity of the 10-layered reflecting layer structure is 90% or more than 90% at the wavelength ranging from 440 nm to 490 nm; a reflectivity of the 16-layered reflecting layer structure is 97% or more than 97% at the wavelength ranging from 440 nm to 490 nm.

In the present disclosure, because a blue light reflectivity of the reflecting layer structure is high, the reflecting layer structure may be used as a blue light reflector and combined with quantum dots to form a quantum dot display with high color gamut.

Figure 5:
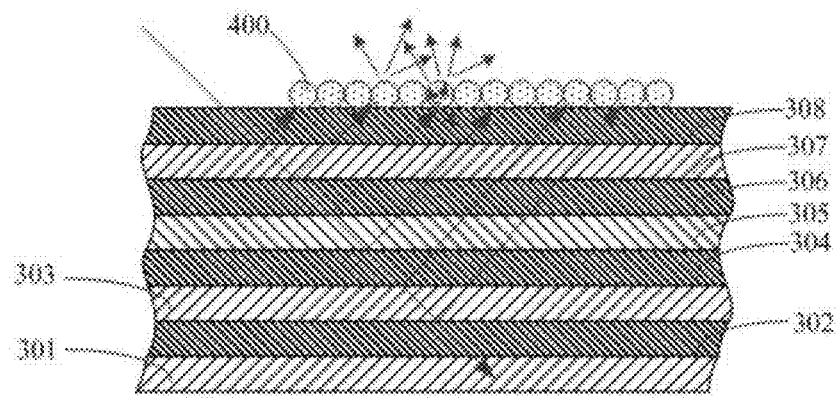
FIG. 5 is a first structural sectional diagram of the reflecting layer and an additional layer provided in the present disclosure.
Figure 6:
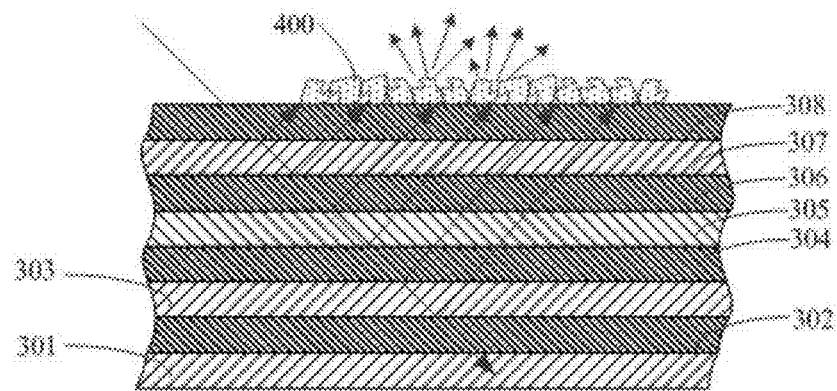
FIG. 6 is a second structural sectional diagram of the reflecting layer and the additional layer provided in the present disclosure.

Referring to FIG. 5 and FIG. 6, FIG. 5 is a first structural sectional diagram of the reflecting layer and an additional layer provided in the present disclosure. FIG. 6 is a second structural sectional diagram of the reflecting layer and an additional layer provided in the present disclosure. The additional layer 400 is disposed on the reflecting layer 300. The reflecting layer is covered by the additional layer 400. Wherein the additional layer 400 includes particulates, and a diameter of each of the particulates ranges from 5 μm to 30 μm. The particulates include one or a combination of two or more materials selected from methyl methacrylate, polystyrene, silicon dioxide, and titanium dioxide. Shapes of the particulates include one or a combination of two or more geometric figures selected from regular geometric figures and irregular geometric figures. The regular geometric figures include triangle, square, rectangle, diamond, parallelogram, and circle. The additional layer 400 includes a second through hole 401. The first through hole 390 and the second through hole 401 penetrate to expose the thin film transistor layer 200.

In the present disclosure, the reflecting layer structure is combined with the additional layer, when light passes through the reflecting layer, it is reflected by the reflecting layer to reach the additional layer. Reflection, refraction, and diffusion of the light through the additional layer solve the problem of specular reflection of the reflecting layer structure, thereby improving uniformity of light and further improving performance of the display panel.

The mini-LED 500 is disposed in the first through hole 390 and the second through hole 401 to electrically connect the thin film transistor layer 200.

The mini-LED 500 may be a blue mini-LED.

In another embodiment, a metal paste layer 600 is disposed on the bottom of the mini-LED 500. A material of the metal paste layer 600 includes one or a combination of two or more materials selected from Sn, In, Bi, Cu, Al, and Mo. In the embodiment, the metal paste layer is tin paste layer. The metal paste layer has properties of adhesiveness and fluidity. The mini-LED 500 is disposed on the metal paste layer 600 utilizing fluidity and adhesiveness of the metal paste layer 600, and then the mini-LED 500 is fixed on the metal paste layer 600 by solidifying the metal paste layer 600, thereby fixing the mini-LED 500 on the thin film transistor layer 200. The mini-LED 500 with the metal paste layer 600 is disposed in the first through hole 390 and the second through hole 401. The mini-LED 500 is electrically connected with the thin film transistor layer 200.

In the present disclosure, the mini-LED is disposed on the metal paste layer by utilizing fluidity and adhesiveness of the metal paste layer, and then the metal paste layer is solidified to further fixing the mini-LED on the thin film transistor layer, thereby preventing the mini-LED from being lost in manufacturing process and using process, which may affect performance of the display panel.

The present disclosure provides a display panel. In the display panel, the reflecting layer is combined with the additional layer, and a structure of the reflecting layer is made of two materials with different refractive indexes. When light passes through the reflecting layer, the light reflected from each layer constructively interferes each other due to change of phase angles and then combine with each other to obtain strong reflected light. Then, the reflected light passes through the additional layer and uniformly falls on the display panel under the function of reflection, refraction and diffusion of the additional layer, which improves uniformity and reflectivity of light, improves luminous efficiency and light utilization of the mini-LED, and reduces power consumption, thereby improving performance of the display panel and reducing manufacturing costs of the display panel. Furthermore, because a blue light reflectivity of the reflecting layer is high, the reflecting layer structure may be used as a blue light reflector and combined with quantum dots to form a quantum dot display with high color gamut.

Figure 7:
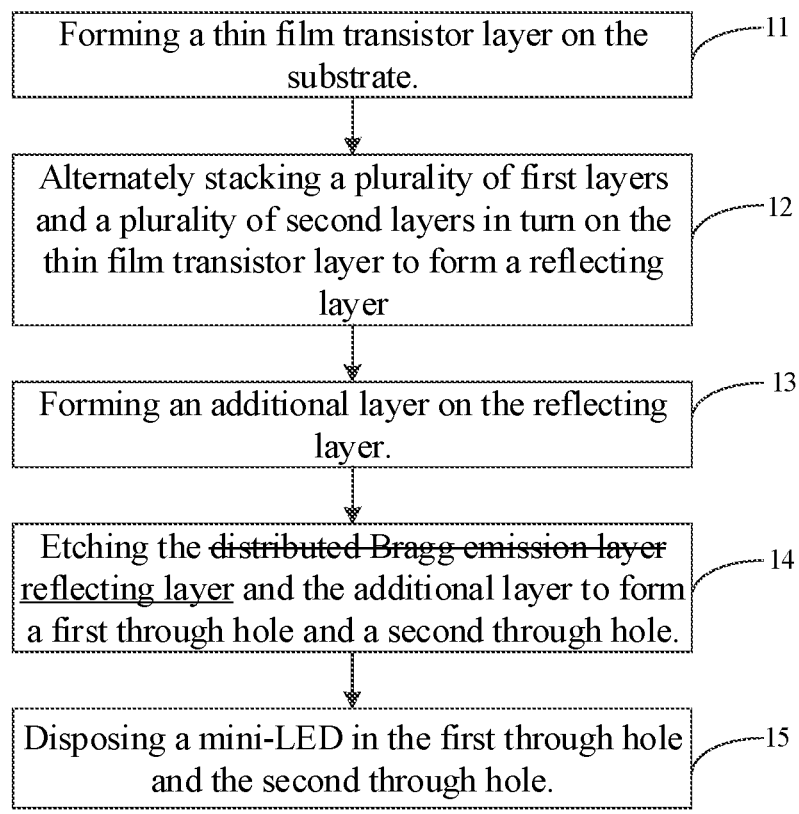
FIG. 7 is a flow chart of a manufacturing method of a display panel provided in the present disclosure.

Referring to FIG. 7, it is a flow chart of a manufacturing method of a display panel provided in the present disclosure. The present disclosure further provides a manufacturing method of a display panel, including:

Providing a substrate.

11, forming a thin film transistor layer 200 on the substrate 100.

A substrate 100 is provided. The substrate 100 may be a glass substrate. The thin film transistor layer 200 is formed on the substrate 100. The thin film transistor layer 200 includes thin film transistors 210. The thin film transistors 210 include gate electrodes 201, a first protective layer 202, a gate insulating layer 203, active layers 204, source electrodes 205, drain electrodes 206, and a second protective layer 207. The gate electrodes 201 are covered by the first protective layer 202. A material of the gate electrodes 201 includes one or a combination of two or more materials selected from Mo, Al, Ti, In, and Ga. The gate insulating layer 203 is disposed on the first protective layer 202. A material of the gate insulating layer 203 includes one or a combination of two or more materials selected from $Al_2O_3$, $SiO_x$, and $SiN_x$. The active layers 204 are disposed on the gate insulating layer 203. A material of the active layers 204 includes amorphous silicon. The source electrodes 205 are disposed on one end of the gate insulating layer 203 and one end of the active layers 204. The drain electrodes 206 are disposed on the other end of the gate insulating layer 203 and the other end of the active layers 204. The source electrodes 205 and the drain electrodes 206 are mutually insulated. The source electrodes 205, the drain electrodes 206 and the gate insulating layer 203 are covered by the second protective layer 207. The second protective layer 207 is configured to protect a structure in the thin film transistors 210, thereby preventing the thin film transistors 210 from being affected by other structures and water oxygen. Besides structures shown in FIG. 2, the thin film transistors 210 also include other structures, which are not listed herein.

12, alternately stacking a plurality of first layers 301 and a plurality of second layers 302 on the thin film transistor layer 200 to form a reflecting layer 300.

A first refractive index material and a second refractive index material are alternately deposited and stacked on the thin film transistor layer to form the reflecting layer 300 with multi-layers. A number of layers of the reflecting layer 300 is not limited. In the embodiment, the reflecting layer 300 has eight layers, that is, two materials with different refractive indexes are alternately laminated to form a total of 8-layered layers, and following 6-layered layers, 10-layered layers, and 16-layered layers are same. The reflecting layer 300 includes a first layer 301, a second layer 302, a third layer 303, a fourth layer 304, a fifth layer 305, a sixth layer 306, a seventh layer 307, and an eighth layer 308. The first layer 301, the third layer 303, the fifth layer 305, and the seventh layer 307 are made of the first refractive index material. A thickness of each of the first layer 301, the third layer 303, the fifth layer 305, and the seventh layer 307 ranges from 55 nm to 65 nm. The second layer 302, the fourth layer 304, the sixth layer 306, and the eighth layer 308 are made of the second refractive index material. A thickness of each of the second layer 302, the fourth layer 304, the sixth layer 306, and the eighth layer 308 ranges from 65 nm to 85 nm. A refractive index of the first refractive index material is greater than a refractive index of the first refractive index material.

In another embodiment, the refractive index of the first refractive index material ranges from 1.7 to 2.2, and the refractive index of the second refractive index material ranges from 1.35 to 1.55.

In another embodiment, in another embodiment, a material of the first refractive index material includes one or a combination of two or more materials selected from SiNx, $TiO_2$, ZnS, and $Al_2O_3$. A material of the second refractive index material includes one or a combination of two materials selected from $SiO_2$ and $MgF_2$.

13, forming an additional layer 400 on the reflecting layer 300.

Particulates are disposed on the reflecting layer 300 to form the additional layer 400. A diameter of each of the particulates ranges from 5 μm to 30 μm. The particulates include one or a combination of two or more materials selected from methyl methacrylate, polystyrene, silicon dioxide, and titanium dioxide. Shapes of the particulates include regular geometric figures and irregular geometric figures. The regular geometric figures include triangle, square, rectangle, diamond, parallelogram, and circle.

14, etching the reflecting layer 300 and the additional layer 400 to form a first through hole 390 and a second through hole 401.

Wherein the first through hole 390 and the second through hole 401 penetrate to expose the thin film transistor layer 200. The etching method is not limited, and corresponding etching method can be adopted according to specific requirements.

15, disposing a mini-LED 500 in the first through hole 390 and the second through hole 401.

Specifically, the mini-LED 500 is disposed on a metal paste layer 600, and the mini-LED 500 with the metal paste layer 600 is disposed in the first through hole 390 and the second through hole 401. The mini-LED 500 may be a blue mini-LED. The mini-LED 500 is electrically connected with the thin film transistor layer 200. A material of the metal paste layer 600 includes one or a combination of two or more materials selected from Sn, In, Bi, Cu, Al, and Mo. In the embodiment, the metal paste layer 600 is tin paste layer.

In the present disclosure, the mini-LED is disposed on the metal paste layer by utilizing fluidity and adhesiveness of the metal paste layer, the mini-LED is further fixed on the metal paste layer by solidifying the metal paste layer, thereby further fixing the mini-LED on thin film transistor layer and preventing the mini-LED from being lost in manufacturing process and using process, which may affect performance of the display panel.

The present disclosure provides a display panel and a manufacturing method of the display panel. In the manufacturing method of the display panel, a structure of the reflecting layer is made of two materials with different refractive indexes which are alternately stacked on the thin film transistor layer. In the present disclosure, the reflecting layer has the advantages of simple structure, good process compatibility with thin film transistor layer, easy to prepare, and low costs, thereby improving manufacturing efficiency of the display panel and reducing manufacturing costs of the display panel.

The above content is detail description for the embodiment of the present disclosure. In this paper, specific examples are applied to explain the principle and mode of implementation of the application, and the description of the above embodiments are only used for helping understand the application. Meanwhile, for those skilled in the art, according to an idea of the present disclosure, there will be changes in a specific embodiment and an application scope. In conclusion, contents of this specification should not be interpreted as a restriction on the present disclosure.

What is claimed is:

1. A display panel, comprising:
   a substrate;
   a thin film transistor layer disposed on the substrate;
   a reflecting layer disposed on the thin film transistor layer,
   wherein the reflecting layer comprises a plurality of first layers and a plurality of second layers, the plurality of first layers and the plurality of second layers are alternately stacked, the plurality of first layers are made of a first refractive index material, the plurality of second layers are made of a second refractive index material, the reflecting layer comprises a first through hole, and the thin film transistor layer is exposed through the first through hole;

an additional layer disposed on the reflecting layer, wherein the additional layer comprises a second through hole, the first through hole and the second through hole penetrate to expose the thin film transistor layer, and the additional layer comprises particulates;

a metal paste layer disposed in the first through hole and the second through hole, wherein the metal paste layer comprises a third through hole; and a mini light emitting diode (mini-LED) disposed in the third through hole to electrically connect the thin film transistor layer.

2. The display panel in claim 1, wherein the particulates comprise one or a combination of two or more materials selected from methyl methacrylate, polystyrene, silicon dioxide, and titanium dioxide.

3. The display panel in claim 1, wherein a diameter of each of the particulates ranges from 5 μm to 30 μm.

4. The display panel in claim 1, wherein a thickness of each of the first layers ranges from 55 nm to 65 nm, and a thickness of each of the second layers ranges from 65 nm to 85 nm.

5. The display panel in claim 1, wherein a refractive index of the first refractive index material is greater than a refractive index of the second refractive index material, the refractive index of the first refractive index material ranges from 1.7 to 2.2, and the refractive index of the second refractive index material ranges from 1.35 to 1.55.

6. The display panel in claim 1, wherein a material of the metal paste layer comprises one or a combination of two or more materials selected from Sn, In, Bi, Cu, Al, and Mo.

7. A display panel, comprising:
a substrate;
a thin film transistor layer disposed on the substrate;
a reflecting layer disposed on the thin film transistor layer, wherein the reflecting layer comprises a plurality of first layers and a plurality of second layers, the plurality of first layers and the plurality of second layers are alternately stacked, the plurality of first layers are made by a first refractive index material, the plurality of second layers are made by a second refractive index material, the reflecting layer comprises a first through hole, and the thin film transistor layer is exposed through the first through hole;
an additional layer disposed on the reflecting layer, wherein the additional layer comprises a second through hole, the first through hole and the second through hole penetrate to expose the thin film transistor layer, and the additional layer comprises particulates; and
a mini-LED disposed in the first through hole and the second through hole to electrically connect the thin film transistor layer.

8. The display panel in claim 7, wherein the particulates comprise one or a combination of two or more materials selected from methyl methacrylate, polystyrene, silicon dioxide, and titanium dioxide.

9. The display panel in claim 7, wherein a diameter of each of the particulates ranges from 5 μm to 30 μm.

10. The display panel in claim 7, wherein a thickness of each of the first layers ranges from 55 nm to 65 nm, and a thickness of each of the second layers ranges from 65 nm to 85 nm.

11. The display panel in claim 7, wherein a refractive index of the first refractive index material is greater than a refractive index of the second refractive index material, the refractive index of the first refractive index material ranges from 1.7 to 2.2, and the refractive index of the second refractive index material ranges from 1.35 to 1.55.

12. A manufacturing method of a display panel, comprising:
providing a substrate;
forming a thin film transistor layer on the substrate;
alternately stacking a plurality of first layers and a plurality of second layers on the thin film transistor layer to form a reflecting layer, wherein the plurality of first layers are made of a first refractive index material, and the plurality of second layers are made of a second refractive index material;
forming an additional layer on the reflecting layer, wherein the additional layer comprises particulates;
etching the reflecting layer and the additional layer to form a first through hole and a second through hole, wherein the first through hole and the second through hole penetrate to expose the thin film transistor layer; and
disposing a mini-LED in the first through hole and the second through hole to electrically connect the thin film transistor layer.

13. The manufacturing method of the display panel in claim 12, wherein the particulates comprise one or a combination of two or more materials selected from methyl methacrylate, polystyrene, silicon dioxide, and titanium dioxide.

14. The manufacturing method of the display panel in claim 12, wherein the diameter of each of the particulates ranges from 5 μm to 30 μm.

15. The manufacturing method of the display panel in claim 12, wherein a thickness of each of the first layers ranges from 55 nm to 65 nm, and a thickness of each of the second layers ranges from 65 nm to 85 nm.

16. The manufacturing method of the display panel in claim 12, wherein a refractive index of the first refractive index material is greater than a refractive index of the second refractive index material, the refractive index of the first refractive index material ranges from 1.7 to 2.2, and the refractive index of the second refractive index material ranges from 1.35 to 1.55.

* * * * *